United States Patent
Choi et al.

(10) Patent No.: US 10,672,985 B2
(45) Date of Patent: Jun. 2, 2020

(54) ORGANIC SOLAR CELL AND METHOD FOR MANUFACTURING SAME

(71) Applicant: LG CHEM, LTD., Seoul (KR)

(72) Inventors: Doowhan Choi, Daejeon (KR); Jaechol Lee, Daejeon (KR); Jinseck Kim, Daejeon (KR); Songrim Jang, Daejeon (KR); Donggu Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/079,668

(22) PCT Filed: Mar. 13, 2017

(86) PCT No.: PCT/KR2017/002658
§ 371 (c)(1),
(2) Date: Aug. 24, 2018

(87) PCT Pub. No.: WO2017/155362
PCT Pub. Date: Sep. 14, 2017

(65) Prior Publication Data
US 2019/0074443 A1    Mar. 7, 2019

(30) Foreign Application Priority Data

Mar. 11, 2016 (KR) .................. 10-2016-0029651

(51) Int. Cl.
*H01L 51/00*   (2006.01)
*H01L 51/44*   (2006.01)
(Continued)

(52) U.S. Cl.
CPC ...... *H01L 51/0007* (2013.01); *H01L 31/0256* (2013.01); *H01L 51/44* (2013.01); *H01L 51/0036* (2013.01); *H01L 51/0043* (2013.01); *H01L 51/4253* (2013.01); *Y02E 10/549* (2013.01)

(58) Field of Classification Search
None
See application file for complete search history.

(56) References Cited

U.S. PATENT DOCUMENTS

2011/0175064 A1*  7/2011  Kim .................. H01L 27/3209
                                                               257/40
2015/0179965 A1*  6/2015  Lee .................... H01L 27/302
                                                              136/256
(Continued)

FOREIGN PATENT DOCUMENTS

KR    101175178 B1    12/2012
KR    101587895 B1    1/2016
(Continued)

OTHER PUBLICATIONS

International Search Report of the International Searching Authority with English translation corresponding to International Patent Application No. PCT/KR2017/002658 dated May 23, 2017. (6 pages).
(Continued)

*Primary Examiner* — Eli S Mekhlin
(74) *Attorney, Agent, or Firm* — Myers Bigel, P.A.

(57) ABSTRACT

The present specification provides an organic solar cell, and a method for manufacturing the same.

11 Claims, 2 Drawing Sheets

(51) Int. Cl.
*H01L 31/0256* (2006.01)
*H01L 51/42* (2006.01)

(56) References Cited

U.S. PATENT DOCUMENTS

| | | | |
|---|---|---|---|
| 2016/0204349 A1* | 7/2016 | Kim | H01L 31/042 136/263 |
| 2017/0121549 A1 | 5/2017 | Kim | |

FOREIGN PATENT DOCUMENTS

| WO | 2014020988 | | 2/2014 |
|---|---|---|---|
| WO | 20115122722 A1 | | 8/2015 |
| WO | WO-2015122722 A1 | * | 8/2015 |
| WO | 2015167230 A1 | | 11/2015 |
| WO | WO-2015167230 A1 | * | 11/2015 |
| WO | 2015190727 A1 | | 12/2015 |

OTHER PUBLICATIONS

Extended European Search Report corresponding to European Patent Application No. 17763622.2, dated Feb. 26, 2019. (7 pages).

Yao et al. "Effects of Solvent Mixtures on the Nanoscale Phase Separation in Polymer Solar Cells" Advanced Functional Materials 18(12):1783-1789 (2008).

He et al. "Recent Advances in Polymer Solar Cells: Realization of High Device Performance by Incorporating Water/Alcohol-Soluble Conjugated Polymers as Electrode Buffer Layer" Advanced Materials 26:1006-1024 (2014).

Ouyang "Efficient polymer solar cells employing a non-conjucated small-molecule electrolyte" Nature Photonics 9:520-524 (2015).

* cited by examiner

【FIG. 1】
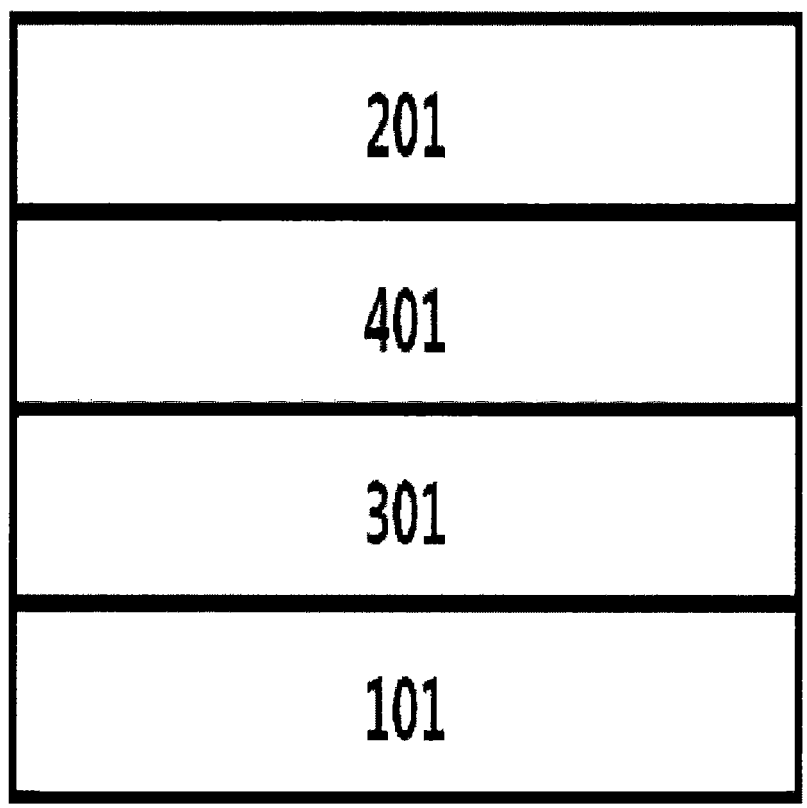

【FIG. 2】
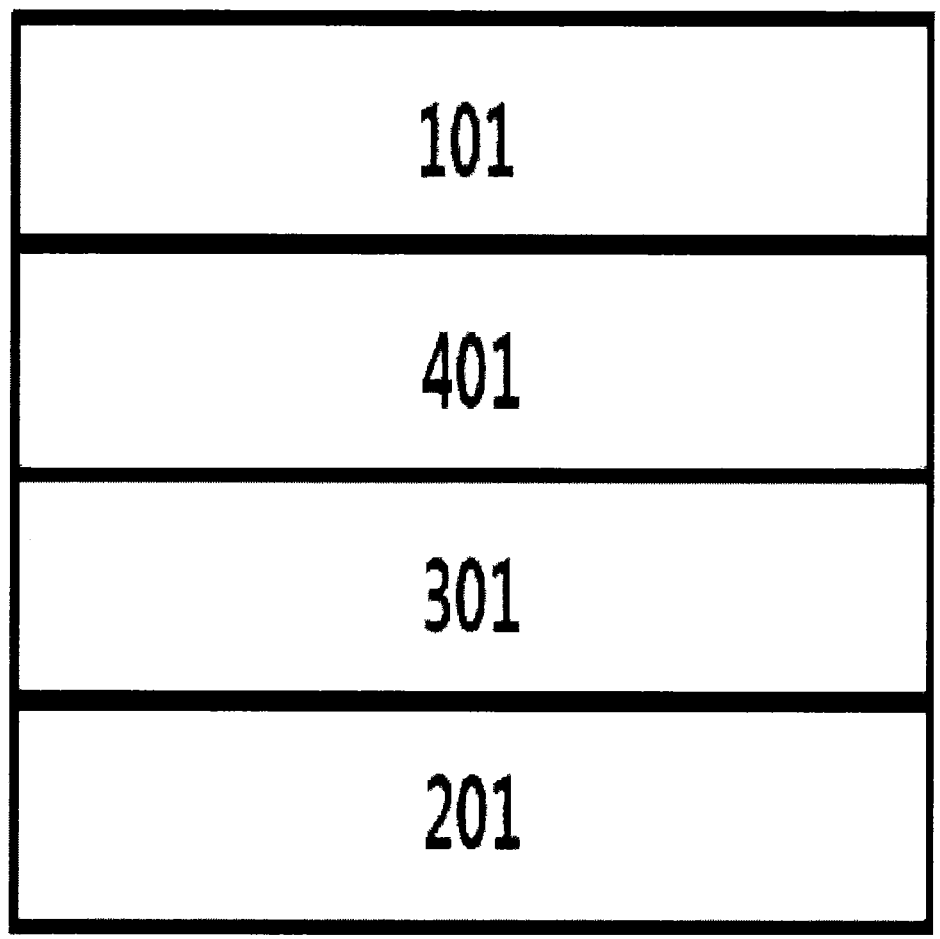

ORGANIC SOLAR CELL AND METHOD FOR MANUFACTURING SAME

CROSS REFERENCE TO RELATED APPLICATIONS

This application is a 35 U.S.C. § 371 national stage application of PCT International Application No. PCT/KR2017/002658, filed on Mar. 13, 2017, which claims priority from Korean Patent Application No. 10-2016-0029651, filed on Mar. 11, 2016, the contents of which are incorporated herein by reference in their entireties. The above-referenced PCT International Application was published in the Korean language as International Publication No. WO 2017/155362 A1 on Sep. 14, 2017.

TECHNICAL FIELD

The present specification claims priority to and the benefits of Korean Patent Application No. 10-2016-0029651, filed with the Korean Intellectual Property Office on Mar. 11, 2016, the entire contents of which are incorporated herein by reference.

The present specification relates to a method for manufacturing an organic solar cell, and an organic solar cell manufactured using the same.

BACKGROUND ART

According to an energy review material published by the NREL, a US National Laboratory, energy sources that are currently used mainly are petroleum, coal and gas. These energy sources amount to 80% of energy sources used in total. However, depletion of petroleum and coal energy has gradually become a big problem currently, and an increase in the emission of carbon dioxide and other greenhouse gases into the air is generating increasingly serious problems. In contrast, the use of renewable energy that is non-polluting green energy is yet about 2% of the total energy source. Thus, concerns about resolving energy source problems have become a motivation for expediting studies on developing new renewable energy. Among the new renewable energy sources such as wind, water and the sun, solar energy has received most attention. Solar cells using solar energy produce less pollution, are limitless in resources and have a semi-permanent lifetime, and therefore, are expected as an energy source capable of resolving future energy problems.

An organic solar cell is a device capable of directly converting solar energy to electric energy by applying a photovoltaic effect. Solar cells are divided into inorganic solar cells and organic solar cells depending on the materials forming a thin film. Typical solar cells are fabricated using a p-n junction by doping crystalline silicon (Si), an inorganic semiconductor. Electrons and holes generated by light absorption spread to p-n junction points, are accelerated by the electric field, and migrate to an electrode. Power conversion efficiency of this process is defined as a ratio of power given to an external circuit and solar power put into a solar cell, and the ratio has been accomplished up to approximately 24% when measured under a currently standardized hypothetical solar irradiation condition. However, existing inorganic solar cells already have limits in economic feasibility and material supplies, and therefore, organic solar cells that are readily processed, inexpensive and have various functions have been highly favored as a long-term alternative energy source.

As for early organic solar cells, the group of Professor Heeger at UCSB of the US has initiatively led the technology development. Monomolecular organic materials or polymer materials used in technologies of a two-step manufacturing process for forming each of a buffer layer and a photoactive layer of an organic solar cell have advantages in that they are readily and quickly used in low-priced and large area processes.

However, a method of manufacturing a buffer layer and photoactive layer in a one-step process through self-phase separation has a problem of not usable in a large-area module solar cell that is not a unit device since constituents of the buffer layer are non-conductors and an ultrathin film needs to be formed. Accordingly, development of technologies capable of being used in a large-area module solar cell while manufacturing a buffer layer and a photoactive layer in a one-step process has been required.

DISCLOSURE

Technical Problem

The present specification is directed to providing a method for manufacturing a highly efficient organic solar cell through a self-phase separation method usable in a large-area module.

Technical Solution

One embodiment of the present specification provides a method for manufacturing an organic solar cell including preparing a first electrode; preparing a solution including a solvent, a buffer material and a photoactive material; forming a buffer layer and a photoactive layer through coating of applying the solution on the first electrode and heat treating the result; and forming a second electrode on the photoactive layer, wherein the solvent includes a phase separation solvent for self-phase separation of the buffer layer and the photoactive layer.

Another embodiment of the present specification provides an organic solar cell manufactured using the method for manufacturing an organic solar cell of the present disclosure.

Advantageous Effects

According to a solar cell according to one embodiment of the present specification, self-phase separation of a buffer layer and a photoactive layer can smoothly occur.

*15 According to the solar cell according to one embodiment of the present specification, the smooth self-phase separation of the buffer layer and the photoactive layer can be used in a large-area module.

According to the solar cell according to one embodiment of the present specification, large photoconversion efficiency can be obtained even when the smooth self-phase separation of the buffer layer and the photoactive layer is used in the large-area module by concentrating light with the photoactive layer.

According to a solar cell according to one embodiment of the present specification, the buffer layer and the photoactive layer can be formed in the large-area module in one step, and shorter process time and process cost savings can be obtained.

DESCRIPTION OF DRAWINGS

FIG. 1 illustrates a sectional diagram of an inverted-structured organic solar cell according to one embodiment of the present specification.

FIG. 2 illustrates a sectional diagram of a normal-structured organic solar cell according to one embodiment of the present specification.

MODE FOR DISCLOSURE

Hereinafter, the present specification will be described in more detail.

In the present specification, a description of a certain member being placed "on" another member includes not only case of the one member adjoining the another member but a case of still another member being present between the two members.

In the present specification, a description of a certain part "including" certain constituents means capable of further including other constituents, and does not exclude other constituents unless particularly stated on the contrary.

One embodiment of the present specification provides a method for manufacturing an organic solar cell including preparing a first electrode; preparing a solution including a solvent, a buffer material and a photoactive material; forming a buffer layer and a photoactive layer through coating of applying the solution on the first electrode and heat treating the result; and forming a second electrode on the photoactive layer, wherein the solvent includes a phase separation solvent for self-phase separation of the buffer layer and the photoactive layer.

In the present specification, the buffer material is a material for forming a buffer layer, and the buffer material may include one or more types selected from the group consisting of metal salts, metal oxides and non-conjugated polyelectrolytes (NPE).

The metal salt of the present specification is capable of forming a buffer layer with no impurities such as a reducing agent or a surfactant through a process of forming metal particles by being reduced with heat treatment, and although not particularly limited in the type, may include one or more types selected from the group consisting of Ag metal salts, Au metal salts, Al metal salts, Cu metal salts, W metal salts and Pt metal salts.

According to one embodiment of the present specification, the Ag metal salt may include one or more selected from the group consisting of AgCl, $AgNO_3$ and AgI. However, the Ag metal salt is not limited thereto.

*27 According to one embodiment of the present specification, the Au metal salt may include one or more selected from the group consisting of $HAuCl_4$, AuCl and $AuCl_3$. However, the Au metal salt is not limited thereto.

According to one embodiment of the present specification, the Cu metal salt may include one or more selected from the group consisting of CuI, $CuF_3$ and $CuNO_3$. However, the Cu metal salt is not limited thereto.

According to one embodiment of the present specification, the Pt metal salt may include one or more selected from the group consisting of $PtCl_2$, $PtCl_4$, $PtBr_2$ and $Pt(C_5H_7O_2)_2$. However, the Pt metal salt is not limited thereto.

The metal oxide of the present specification may perform a role of a conductive oxide in the buffer layer, and although not particularly limited in the type, may be one or more types selected from the group consisting of molybdenum oxide ($MoO_3$), vanadium oxide ($VO_x$), nickel oxide (NiO), zinc oxide (ZnO); titanium oxide ($TiO_2$); zirconium oxide ($ZrO_2$); tantalum oxide ($Ta_2O_3$); cesium oxide ($Cs_2CO_3$); magnesium oxide (MgO); hafnium oxide ($HfO_2$); tungsten oxide ($WO_3$); and zinc oxide (ZnO) doped with aluminum (Al) or gallium (Ga).

According to one embodiment of the present specification, the non-conjugated polyelectrolyte may perform a role of transferring electrons in the buffer layer, and although not particularly limited as long as it is capable of transferring electrons, may include one or more types selected from the group consisting of polyethyleneimine (PEI), polyethyleneimine ethoxylate (PEIE) and polyallylamine (PAA).

According to one embodiment of the present specification, the photoactive material is for forming a photoactive layer, and the photoactive material may include an electron donor material and an electron acceptor material. In the present specification, the photoactive material may mean the electron donor material and the electron acceptor material.

In one embodiment of the present specification, the electron donor material and the electron acceptor material may have a mass ratio of 1:10 to 10:1. Specifically, the electron acceptor material and the electron donor material of the present specification may have a mass ratio of 1:0.5 to 1:5.

According to one embodiment of the present specification, the electron donor material may include at least one type of electron donor; or a polymer of at least one type of electron acceptor and at least one type of electron donor. The electron donor material may include at least one type of electron donor. In addition, the electron donor material includes a polymer of at least one type of electron acceptor and at least one type of electron donor.

Specifically, the electron donor material may be various polymer materials and monomer materials such as thiophene-based, fluorene-based or carbazole based starting with poly[2-methoxy-5-(2'-ethyl-hexyloxy)-1,4-phenylene vinylene] (MEH-PPV).

Specifically, the monomer material may include one or more types of materials selected from the group consisting of copper(II) phthalocyanine, zinc phthalocyanine, tris[4-(5-dicyanomethylidenemethyl-2-thienyl)phenyl]amine, 2,4-bis[4-(N,N-dibenzylamino)-2,6-dihydroxyphenyl]squaraine, benz[b]anthracene, and pentacene.

Specifically, the polymer material may include one or more types of materials selected from the group consisting of poly 3-hexyl thiophene (P3HT), poly[N-9'-heptadecanyl-2,7-carbazole-alt-5,5-(4'-7'-di-2-thienyl-2',1',3'-benzothiadiazole)] (PCDTBT), poly[2,6-(4,4-bis-(2,ethylhexyl)-4H-cyclopenta[2,1-b;3,4-b']dithiophene)-alt-4,7-(2,1,3-benzothiadiazole)] (PCPDTBT), poly[2,7-(9,9-dioctyl-fluorene)-alt-5,5-(4,7-di-2-thienyl-2,1,3-benzothiadiazole)] (PFO-DBT), poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), and poly[2,7-(9,9-dioctyl-dibenzosilole)-alt-4,7-bis(thiophen-2-yl)benzo-2,1,3-thiadiazole] (PSiF-DBT).

According to one embodiment of the present specification, the photoactive material may include the following copolymer.

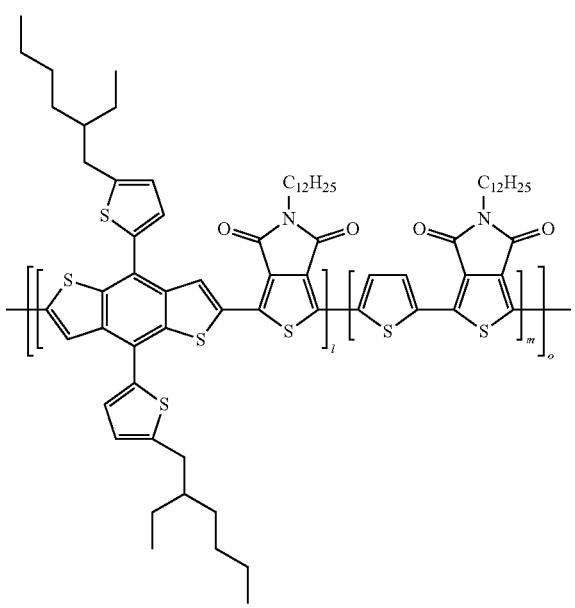

l is a mole fraction, and 0<l<1,
m is a mole fraction, and 0<m<1,
l+m=1, and
o is an integer of 0<o<1,000.

In one embodiment of the present specification, l is 0.5. In another embodiment, m is 0.5.

In one embodiment of the present specification, the copolymer may be synthesized by the examples to describe later.

In one embodiment of the present specification, an end group of the copolymer may be a heterocyclic group or an aryl group.

In one embodiment of the present specification, an end group of the copolymer may be a 4-(trifluoromethyl)phenyl group.

According to one embodiment of the present specification, the copolymer may have a number average molecular weight of 500 g/mol to 1,000,000 g/mol. Specifically, the copolymer may have a number average molecular weight of 10,000 g/mol to 100,000 g/mol. In addition, in one embodiment of the present specification, the copolymer has a number average molecular weight of 30,000 g/mol to 70,000 g/mol.

According to one embodiment of the present specification, the copolymer may have molecular weight distribution of 1 mol to 100 mol. Specifically, the copolymer may have molecular weight distribution of 1 to 3.

As the molecular weight distribution decreases and the number average molecular weight increases, electrical properties and mechanical properties become more favorable.

In addition, the number average molecular weight may be 100,000 g/mol or less in order to have solubility at a certain level or higher and facilitate solution coating.

According to one embodiment of the present specification, the compound may be included as an electron donor in the photoactive material.

According to one embodiment of the present specification, the forming of a buffer layer and a photoactive layer may be by self-phase separation.

The buffer layer may mean a layer transferring "holes" or "electrons". In addition, the buffer layer may be an electron transfer layer, a charge transfer layer or a hole transfer layer.

In the photoactive layer, the electron donor material forms excitons pairing electrons and holes, and the excitons are separated into electrons and holes at an interface of the electron donor/electron acceptor. The separated electrons and holes migrate to the electron donor material and the electron acceptor material, respectively, and by these being collected in a first electrode and a second electrode, respectively, an organic solar cell may be externally used as electric energy.

In addition, in one embodiment of the present specification, the photoactive layer may have a bulk heterojunction structure or a bi-layer junction structure. The bulk heterojunction structure may be a bulk heterojunction (BHJ) type, and the bi-layer junction structure may be a bi-layer junction type.

The self-phase separation means two or more groups having different properties under a certain condition being separated into each group, and in the present specification, the self-phase separation may be induced through heat treating the solution including a solvent, a buffer material and a photoactive material.

According to one embodiment of the present specification, the coating may be by any one selected from the group consisting of bar coating, slot die coating, doctor blade coating, screen coating and spin coating. Specifically, the coating may be by bar coating.

In a unit device that is a small-area module of 1 cm² or less, a coating method such as spin coating may be used, however, this method may not be used in large-area coating, and has a problem in that patterning, an essential condition to manufacture a device, may not be performed. However, the solution according to one embodiment of the present specification may also be used in a large-area module, and therefore, the bar coating method usable in a large-area module may be used, and coating efficiency may be enhanced therefrom.

According to one embodiment of the present specification, the heat treatment temperature may be from 20° C. to 70° C. More specifically, the heat treatment temperature may be from 30° C. to 40° C.

According to one embodiment of the present specification, the solvent may include a phase separation solvent in order to enhance an effect of inducing self-phase separation of the buffer layer and the photoactive layer.

The type of the phase separation solvent is not particularly limited as long as it is a material inducing self-phase separation, however, the solvent may be a material having a boiling point of 200° C. to 230° C. and density of 1 g/cm³ to 5 g/cm³. When a boiling point and density of the phase separation solvent are outside the above-mentioned range, phase separation may not be induced, which requires an additional process, and as a result, process efficiency may decrease.

Specific examples of the phase separation solvent are not particularly limited, but may be 1,2,4-trichlorobenzene (TCB).

In addition, the phase separation solvent may be included in 2% by weight to 8% by weight with respect to 100% by weight of the solution. Specifically, the phase separation solvent may be included in 2% by weight to 5% by weight with respect to 100% by weight of the solution. More specifically, the phase separation solvent may be included in 3% by weight with respect to 100% by weight of the solution.

One embodiment of the present specification may provide an organic solar cell manufactured using the method for manufacturing an organic solar cell of the present specification.

In addition, one embodiment of the present specification may provide an organic solar cell having an inverted structure in which the first electrode is a cathode and the second electrode is an anode, and the buffer layer is provided between the first electrode and the photoactive layer.

FIG. 1 illustrates an inverted-structured organic solar cell, one example of the organic solar cell according to one embodiment of the present specification. When referring to FIG. 1, a buffer layer (301) is formed between a first electrode (101) and a photoactive layer (401), and a second electrode (201) is provided on the photoactive layer (401).

The inverted structure may mean forming a cathode on a substrate. Specifically, according to one embodiment of the present specification, the first electrode formed on a substrate may be a cathode when the organic solar cell has an inverted structure. In this case, the first electrode may be a transparent electrode or a translucent electrode.

When the first electrode is a transparent electrode, it may be a transparent conductive oxide, and in this case, the first electrode may be a conductive oxide such as indium tin oxide (ITO) or indium zinc oxide (IZO). Furthermore, the first electrode may be a translucent electrode. When the first electrode is a translucent electrode, it may be prepared with a translucent metal such as Ag, Au, Mg, Ca or alloys thereof. When using a translucent metal as the first electrode, the organic solar cell may have a microcavity structure.

When the first electrode of the present specification is a transparent conductive oxide, the first electrode may include, in addition to glass and a quartz plate, those doping a material having conductivity on a flexible and transparent material such as plastic including polyethylene terephthalate (PET), polyethylene naphthalate (PEN), polypropylene (PP), polyimide (PI), polycarbonate (PC), polystyrene (PS), polyoxymethylene (POM), an acrylonitrile styrene (AS) resin (copolymer), an acrylonitrile butadiene styrene (ABS) resin (copolymer), triacetyl cellulose (TAC), polyarylate (PAR) and the like. Specifically, indium tin oxide (ITO), fluorine-doped tin oxide (FTO), aluminum-doped zinc oxide (AZO), indium zinc oxide (IZO), ZnO—$Ga_2O_3$, ZnO—$Al_2O_3$, antimony tin oxide (ATO) and the like may be included, and more specifically, ITO may be included.

*72 The inverted-structured organic solar cell of the present specification may mean an organic solar cell in which an anode and a cathode of an organic solar cell having a general structure are formed in a reverse direction. An Al layer used in an organic solar cell having a general structure is very vulnerable to an oxidation reaction in the air, and has a limit in commercializing through a printing process since preparing in an ink form is difficult. However, the organic solar cell of the present specification having a structure in a reverse direction is capable of using Ag instead of Al, and therefore, is stable for an oxidation reaction compared to an organic solar cell having a general structure, and an Ag ink is readily prepared, which is advantageous in commercializing through a printing process.

Another embodiment may provide an organic solar cell having normal structure in which the first electrode is an anode and the second electrode is a cathode, and the buffer layer is provided between the second electrode and the photoactive layer.

FIG. 2 illustrates a normal-structured organic solar cell, one example of the organic solar cell according to one embodiment of the present specification. When referring to FIG. 2, a buffer layer (301) is formed between a second electrode (201) and a photoactive layer (401), and a first electrode (101) is provided on the photoactive layer (401).

The normal structure may mean forming an anode on a substrate. Specifically, according to one embodiment of the present specification, the first electrode formed on a substrate may be an anode when the organic solar cell has a normal structure. In this case, the second electrode may be a metal electrode.

When the second electrode of the present specification is a metal electrode, the second electrode may include one, two or more types selected from the group consisting of silver (Ag), aluminum (Al), platinum (Pt), tungsten (W), copper (Cu), molybdenum (Mo), gold (Au), nickel (Ni) and palladium (Pa. Even more specifically, the metal electrode may be silver (Ag).

According to one embodiment of the present specification, the organic solar cell may further include a substrate. Specifically, the substrate may be provided below the first electrode.

According to one embodiment of the present specification, substrates having excellent transparency, surface smoothness, handling easiness and water resistance may be used as the substrate. Specifically, a glass substrate, a thin film glass substrate or a transparent plastic substrate may be used. As the plastic substrate, films such as polyethylene terephthalate (PET), polyethylene naphthalate (PEN), polyether ether ketone (PEEK) and polyimide (PI) may be included in a monolayer or multilayer form. However, the substrate is not limited thereto, and substrates commonly used in an organic solar cell may be used.

In one embodiment of the present specification, the forming of a first electrode and/or a second electrode may include cleaning a patterned ITO substrate consecutively with a cleaning agent, acetone and isopropanol (IPA), then drying the substrate on a heating plate for 1 minute to 30 minutes at 100° C. to 250° C., specifically for 10 minutes at 250° C., for removing moisture, and then modifying the substrate surface to be hydrophilic when the substrate is completely cleaned. Preprocessing technologies for this may include a) a surface oxidation method using parallel plate discharge, b) a method of oxidizing the surface through ozone generated by UV rays in a vacuum, and c) an oxidation method using the oxygen radicals generated by plasma. Through the surface modification such as above, the junctional surface potential may be maintained at a level suitable for the surface potential of a hole injection layer, a polymer thin film may be readily formed on the ITO substrate, the quality of the thin film may be improved. One of the methods described above is selected depending on the condition of the substrate, however, no matter which method is used, it is commonly preferred to prevent the leave of oxygen on the substrate surface and to suppress the remaining of moisture and organic materials as much as possible in order to expect practical effects of the preprocessing.

According to one embodiment of the present specification, a method of oxidizing the surface through ozone generated by UV may be used as the method of oxidizing the substrate. In this case, the patterned ITO substrate may be fully dried by baking the patterned ITO substrate on a hot plate after being ultrasonic cleaned, and the patterned ITO substrate is introduced into a chamber and then cleaned by ozone generated by reacting oxygen gas with UV light using a UV lamp. However, the method of surface modification of the patterned ITO substrate in the present disclosure is not particularly limited, and any method oxidizing a substrate may be used.

Hereinafter, the present specification will be described in detail with reference to examples in order to specifically describe the present specification. However, examples according to the present specification may be modified to various different forms, and the scope of the present specification is not construed as being limited to the examples described below. Examples of the present specification are provided in order to more fully describe the present specification to those having average knowledge in the art.

Example 1

In order to synthesize a copolymer included in a photoactive material according to one embodiment of the present specification, the copolymer was formed by the following Reaction Formula 1.

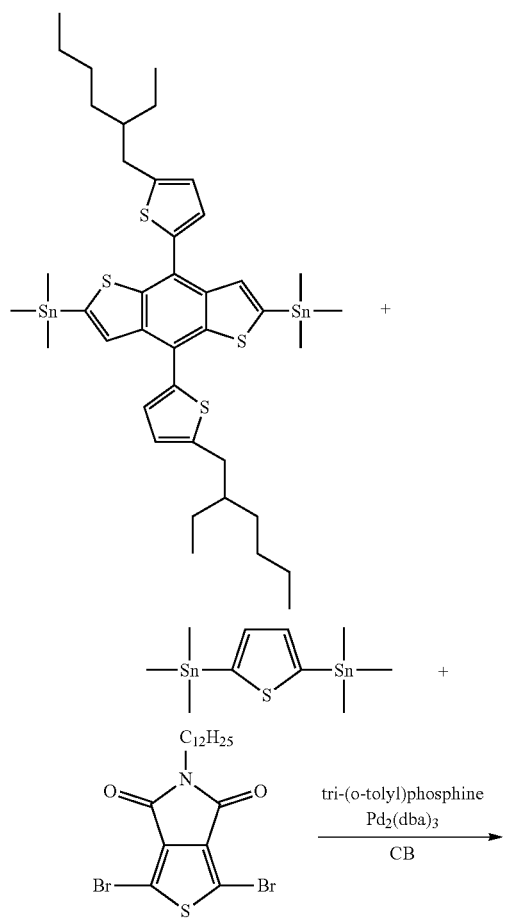

[Reaction Formula 1]

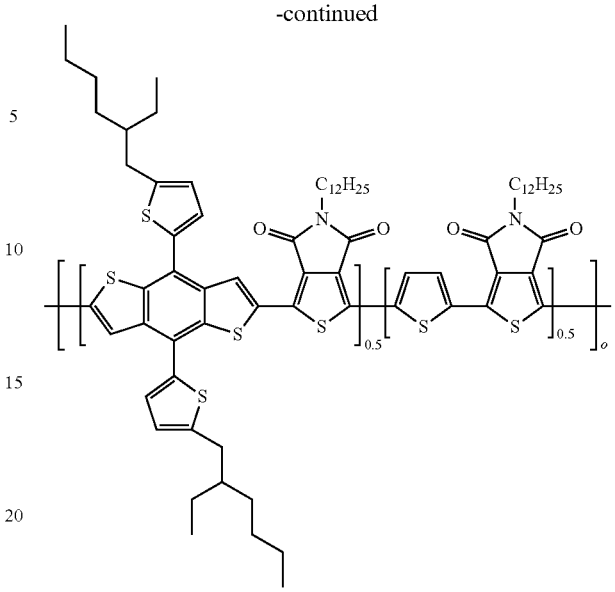

Chlorobenzene (15 ml), 2,6-bis(trimethyltin)-4,8-bis(2-ethylhexyl-2-thienyl)-benzo[1,2-b:4,5-b']dithiophene (0.7 g, 0.7738 mmol), 2,5-bis(trimethylstannyl)thiophene (0.3171 g, 0.7738 mmol), 1,3-dibromo-5-dodecylthieno[3,4-c]pyrrole-4,6-dione (0.7418 g, 1.548 mmol), tris(dibenzylideneacetone)dipalladium (0) (Pd$_2$(dba)$_3$, 28 mg), tri-(o-tolyl)phosphine (37 mg) were placed in a microwave reactor vial, and reacted for 1 hour under a 170° C. condition. The mixture was cooled to room temperature, methanol was poured thereinto, and then solids were filtered and then Soxhlet extracted using methanol, acetone, hexane and chloroform. The chloroform portion was precipitated again in methanol to filter solids.

Example 2

In order to prepare a PEI solution, PEI and 1-butanol were mixed in a mass, ratio of 1:499, and stored for 24 hours or longer. A photoactive layer solution was prepared to have an approximately 3 wt % concentration employing a donor and an acceptor (CF, CB, ODCB or mixed solution of two or more thereof) in a 1:2 ratio.

The photoactive layer solution according to one embodiment of the present specification was prepared by adding the PEI solution to the photoactive layer solution prepared above. In the structure (ITO/125:PC61BM:PEI/MoO3/Ag) prepared according to one embodiment of the present specification, 1,2,4-trichlorobenzene was included in 3% by weight, and a device was manufactured by coating while maintaining the temperature of the substrate and the temperature of the photoactive layer solution identically at 40° C.

Comparative Example 1

A device was manufactured in the same manner as in Example 2 except for the step of coating while maintaining the temperature identically at 40° C.

Comparative Example 2

A device was manufactured in the same manner as in Example 2 except that 1,2,4-trichlorobenzene was included in 10% by weight.

Comparative Example 3

A device was manufactured in a general structure (ITO/ZnO/125:PC61BM/MoO3/Ag) used in the art.

Comparative Example 4

A device was manufactured without 1,2,4-trichlorobenzene and a process of heat treating the substrate and the solution in the structure (ITO/125:PC61BM:PEI/MoO3/Ag) according to one embodiment of the present specification.

Properties of the organic solar cells manufactured in the examples and the comparative examples are shown in the following Table 1.

The module size of the organic solar cells was 9 cm×1.5 cm=13.5 cm², which is a large-area module instead of an existing small-area module of 1 cm² or less.

TABLE 1

|  | $V_{oc}$ (V) | $J_{sc}$ (mA/cm²) | FF | PCE (%) |
| --- | --- | --- | --- | --- |
| Example 2 | 4.833 | 2.516 | 0.579 | 7.03 |
| Comparative Example 1 | 4.8 | 2.622 | 0.48 | 6.04 |
| Comparative Example 2 | 3.79 | 1.66 | 0.38 | 2.39 |
| Comparative Example 3 | 4.862 | 2.5 | 0.560 | 6.81 |
| Comparative Example 4 | 3.891 | 2.334 | 0.375 | 3.41 |

In the present specification, the $V_{oc}$ means an open voltage, the $J_{sc}$ means a short-circuit current, the FF means a fill factor, and the PCE means power conversion efficiency. The open voltage and the short-circuit current are each an x-axis and a y-axis intercept in the four quadrants of a voltage-current density curve, and as these two values increase; organic solar cell efficiency is enhanced. In addition, the fill factor is a value dividing the rectangle area that may be drawn inside the curve by the product of the short-circuit current and the open voltage. The power conversion efficiency may be obtained when these three values are divided by the intensity of irradiated light, and target effects are obtained as the value is higher.

As can be seen from Table 1, the organic solar cells according to the examples exhibited superior efficiency when using 1,2,4-trichlorobenzene as the phase separation solvent and setting the temperature condition at a certain temperature compared to the organic solar cells according to the comparative examples lacking these conditions.

As can be seen from Table 1, it was identified that the solar cells according to the examples had enhanced current density by enhancing a light absorption ability of the photoactive layer due to a light concentrating effect of Ag nanoparticles, and had a high fill factor since conductivity of the buffer layer was enhanced by Ag nanoparticles, and a decrease in the current density caused by voltage was smaller.

What is claimed is:

1. A method for manufacturing an organic solar cell comprising:
   forming a buffer layer and a photoactive layer on a first electrode by coating a solution onto the first electrode and heat treating the solution coated onto the first electrode, the solution comprising a solvent, a buffer material, and a photoactive material; and
   forming a second electrode on the photoactive layer,
   wherein the solvent includes a phase separation solvent for self-phase separation of the buffer layer and the photoactive layer,
   wherein the phase separation solvent is 1,2,4-trichlorobenzene (TCB), and
   wherein the phase separation solvent is 2% by weight to 6% by weight of the solution.

2. The method for manufacturing the organic solar cell of claim 1, wherein the buffer material includes one or more types selected from the group consisting of metal salt, metal oxide and non-conjugated polyelectrolyte (NPE).

3. The method for manufacturing the organic solar cell of claim 2, wherein the metal salt includes one or more types selected from the group consisting of Ag metal salts, Au metal salts, Al metal salts, Cu metal salts, W metal salts and Pt metal salts.

4. The method for manufacturing the organic solar cell of claim 2, wherein the metal oxide is one or more types selected from the group consisting of molybdenum oxide ($MoO_3$), vanadium oxide ($VO_x$), nickel oxide (NiO), zinc oxide (ZnO), titanium oxide ($TiO_2$), zirconium oxide ($ZrO_2$), tantalum oxide ($Ta_2O_3$), cesium oxide ($Cs_2CO_3$), magnesium oxide (MgO), hafnium oxide ($HfO_2$), tungsten oxide ($WO_3$), and zinc oxide (ZnO) doped with aluminum (Al) or gallium (Ga).

5. The method for manufacturing the organic solar cell of claim 2, wherein the non-conjugated polyelectrolyte includes one or more types selected from the group consisting of polyethyleneimine (PEI), polyethyleneimine ethoxylate (PETE) and polyallylamine (PAA).

6. The method for manufacturing the organic solar cell of claim 1, wherein the photoactive material includes the following copolymer:

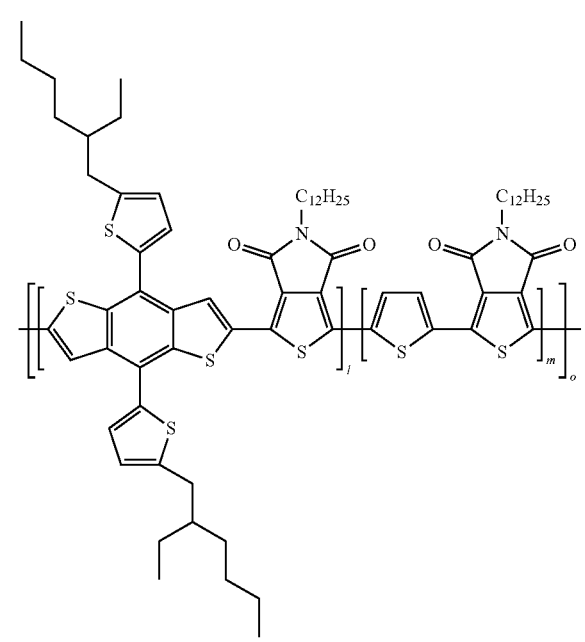

l is a mole fraction, and 0<l<1;
m is a mole fraction, and 0<m<1;
l+m=1; and
o is an integer of 0<o<1,000.

7. The method for manufacturing the organic solar cell of claim 1, wherein the forming of the buffer layer and the photoactive layer is by self-phase separation.

8. The method for manufacturing the organic solar cell of claim 1, wherein the coating is bar coating, slot die coating or doctor blade coating.

9. The method for manufacturing the organic solar cell of claim 1, wherein the heat treating is carried out at a temperature of from 20° C. to 70° C.

10. The method for manufacturing the organic solar cell of claim 1, wherein the phase separation solvent is 2% by weight to 5% by weight of the solution.

11. The method for manufacturing the organic solar cell of claim 1, wherein the phase separation solvent is 3% by weight of the solution.

* * * * *

UNITED STATES PATENT AND TRADEMARK OFFICE
CERTIFICATE OF CORRECTION

PATENT NO. : 10,672,985 B2
APPLICATION NO. : 16/079668
DATED : June 2, 2020
INVENTOR(S) : Choi et al.

Page 1 of 1

It is certified that error appears in the above-identified patent and that said Letters Patent is hereby corrected as shown below:

In the Claims

Column 12, Line 30, Claim 5: Please correct "(PETE)" to read -- (PEIE) --

Signed and Sealed this
Twenty-seventh Day of October, 2020

Andrei Iancu
*Director of the United States Patent and Trademark Office*